US012648270B2

(12) United States Patent
Zeng et al.

(10) Patent No.: US 12,648,270 B2
(45) Date of Patent: Jun. 2, 2026

(54) LIGHT-EMITTING DEVICE AND MANUFACTURING METHOD THEREOF, TAILLIGHT AND VEHICLE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Cheng Zeng, Beijing (CN); Jaeho Lee, Beijing (CN); Dongyu Gao, Beijing (CN); Guangri Yu, Beijing (CN); Fei Chen, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 374 days.

(21) Appl. No.: 18/278,229

(22) PCT Filed: Nov. 29, 2022

(86) PCT No.: PCT/CN2022/135083
§ 371 (c)(1),
(2) Date: Aug. 22, 2023

(87) PCT Pub. No.: WO2024/113167
PCT Pub. Date: Jun. 6, 2024

(65) Prior Publication Data
US 2025/0040314 A1 Jan. 30, 2025

(51) Int. Cl.
*H10H 20/851* (2025.01)
*F21S 41/141* (2018.01)
(Continued)

(52) U.S. Cl.
CPC ....... *H10H 20/8512* (2025.01); *F21S 41/141* (2018.01); *H10H 20/854* (2025.01);
(Continued)

(58) Field of Classification Search
CPC .. F21S 41/141; F21S 43/145; F21S 43/26271; H10H 20/8512; H10H 20/0361;
(Continued)

(56) References Cited

U.S. PATENT DOCUMENTS

2018/0047800 A1* 2/2018 Choi ................... H10K 59/878
2018/0122869 A1 5/2018 Jiang
(Continued)

FOREIGN PATENT DOCUMENTS

CN          105097879 A      11/2015
CN          106129094 A      11/2016
(Continued)

OTHER PUBLICATIONS

EP 22966765, Extended European Search Report, Oct. 14, 2025.

*Primary Examiner* — Didarul A Mazumder
(74) *Attorney, Agent, or Firm* — The Webb Law Firm

(57) ABSTRACT

The present disclosure provides a light-emitting device and a manufacturing method thereof, a taillight and a vehicle. The light-emitting device includes at least one light-emitting element located on one side of a backplane, wherein a wavelength of a first light emitted by each light-emitting element is 500 nm to 580 nm; a wavelength conversion layer located on one side of the at least one light-emitting element away from the backplane and configured to emit a second light with a different color from the first light under the excitation of the first light; and a first optical structure located on one side of the wavelength conversion layer away from the backplane, and including one or more optical (Continued)

elements, each of which is configured to focus the second light along a direction perpendicular to the backplane.

19 Claims, 8 Drawing Sheets

(51) Int. Cl.
| | |
|---|---|
| *H10H 20/01* | (2025.01) |
| *H10H 20/854* | (2025.01) |
| *H10H 20/855* | (2025.01) |

(52) U.S. Cl.
CPC ....... *H10H 20/855* (2025.01); *H10H 20/0361* (2025.01); *H10H 20/0362* (2025.01); *H10H 20/0363* (2025.01)

(58) Field of Classification Search
CPC .............. H10H 20/851; H10H 20/855; H10H 20/0363; H10H 20/0362; H10K 50/858; H10K 59/879; H10K 59/8731; H10K 59/874; H10K 59/878; H10K 50/844; H01L 25/0753
USPC ................................................ 257/79; 438/22
See application file for complete search history.

(56) References Cited

U.S. PATENT DOCUMENTS

| | | | |
|---|---|---|---|
| 2018/0175254 A1 | 6/2018 | Chung et al. | |
| 2018/0277026 A1 | 9/2018 | Xu et al. | |
| 2019/0088186 A1 | 3/2019 | Huang et al. | |
| 2020/0048546 A1 | 2/2020 | Kanzaki et al. | |
| 2020/0200355 A1 | 6/2020 | Calais | |
| 2020/0215963 A1 | 7/2020 | Lahmer | |
| 2020/0235084 A1* | 7/2020 | Wu ....................... | H10W 90/00 |
| 2020/0258946 A1* | 8/2020 | Kim ..................... | H10K 59/874 |
| 2020/0259052 A1 | 8/2020 | Haiberger et al. | |
| 2021/0359231 A1 | 11/2021 | Zhaosong | |
| 2021/0399260 A1 | 12/2021 | Kim et al. | |
| 2022/0190039 A1* | 6/2022 | Sun ...................... | H10K 59/879 |
| 2022/0199948 A1* | 6/2022 | Yeo .................... | H10K 59/8731 |
| 2023/0060696 A1 | 3/2023 | Li et al. | |
| 2023/0163251 A1* | 5/2023 | Choi ................... | H01L 25/0753 257/79 |

FOREIGN PATENT DOCUMENTS

| | | |
|---|---|---|
| CN | 206739014 U | 12/2017 |
| CN | 107942585 A | 4/2018 |
| CN | 108400253 A | 8/2018 |
| CN | 208457842 U | 2/2019 |
| CN | 109473560 A | 3/2019 |
| CN | 109523908 A | 3/2019 |
| CN | 109755413 A | 5/2019 |
| CN | 109844578 A | 6/2019 |
| CN | 109873085 A | 6/2019 |
| CN | 110914108 A | 3/2020 |
| CN | 111380033 A | 7/2020 |
| CN | 111933824 A | 11/2020 |
| CN | 112382648 A | 2/2021 |
| CN | 113097403 A | 7/2021 |
| CN | 113113453 A | 7/2021 |
| CN | 113739115 A | 12/2021 |
| CN | 113851516 A | 12/2021 |
| CN | 114284314 A | 4/2022 |
| CN | 114394999 A | 4/2022 |
| CN | 114628439 A | 6/2022 |
| EP | 3944345 A1 | 1/2022 |
| JP | 2021021875 A | 2/2021 |
| KR | 1020110078319 A | 7/2011 |
| KR | 1020180051453 A | 5/2018 |
| KR | 20210112806 A | 9/2021 |
| WO | 2021107698 A1 | 6/2021 |
| WO | 2022038452 A1 | 2/2022 |

* cited by examiner

| | |
|---|---|
| Form at least one light-emitting element on one side of a backplane | 1202 |
| Form a wavelength conversion layer on one side of the at least one light-emitting element away from the backplane | 1204 |
| Form a first optical structure on one side of the wavelength conversion layer away from the backplane | 1206 |

72
70
30
10

BP 72
60
10

BP

LIGHT-EMITTING DEVICE AND MANUFACTURING METHOD THEREOF, TAILLIGHT AND VEHICLE

CROSS-REFERENCE TO RELATED APPLICATION

This application is the United States National Phase of International Application No. PCT/CN2022/135083, filed Nov. 29, 2022, the disclosure of which is hereby incorporated by reference in its entirety.

BACKGROUND OF THE INVENTION

Field of the Invention

The present disclosure relates to a light-emitting device and a manufacturing method thereof, a taillight and a vehicle.

Description of Related Art

The taillight of the vehicle influences the safety performance during the travel process of the vehicle. The vehicle enterprises have higher and higher requirements for the performance of the taillight of the vehicle. For example, the taillight is required to have high brightness, a long service life and optimized visual angle color cast.

SUMMARY OF THE INVENTION

According to one aspect of the embodiments of the present disclosure, a light-emitting device is provided. The light-emitting device comprises: at least one light-emitting element located on one side of a backplane, wherein a wavelength of a first light emitted by each of the at least one light-emitting element is 500 nm to 580 nm; a wavelength conversion layer located on one side of the at least one light-emitting element away from the backplane and configured to emit a second light with a different color from the first light under excitation of the first light; and a first optical structure located on one side of the wavelength conversion layer away from the backplane, and comprising one or more optical elements, each of the one or more optical elements being configured to focus the second light along a direction perpendicular to the backplane.

In some embodiments, the wavelength conversion layer is a red light quantum dot layer.

In some embodiments, the light-emitting device further comprises: an encapsulation layer located between the at least one light-emitting element and the first optical structure.

In some embodiments, the first optical structure further comprises: a substrate located between the at least one optical element and the encapsulation layer.

In some embodiments, a material of at least one optical element of the one or more optical elements is the same as a material of the substrate, and the at least one optical element and the substrate are integrally provided.

In some embodiments, at least one of the one or more optical elements comprises: a first surface close to the backplane; and a second surface connected with the first surface and located on one side of the first surface away from the backplane, wherein the second surface is at least a part of a curved surface of a half of a solid, and the solid is one of a sphere and an ellipsoid.

In some embodiments, the first surface is a plane.

In some embodiments, the solid is a sphere having a radius of 10 microns to 25 microns.

In some embodiments, the one or more optical elements comprise a group of optical elements arranged in a matrix.

In some embodiments, a distance between any two adjacent optical elements is 10 microns to 20 microns.

In some embodiments, the light-emitting device further comprises: a second optical structure located between the first optical structure and the encapsulation layer, and comprising a dimming portion, wherein a refractive index of the dimming portion is smaller than a refractive index of the substrate.

In some embodiments, the second optical structure further comprises: a plurality of supports, wherein the dimming portion is in a gap between any two adjacent supports of the plurality of supports.

In some embodiments, the dimming portion comprises optical medium.

In some embodiments, the optical medium is air.

In some embodiments, one of the encapsulation layer and the wavelength conversion layer is located between the other and the at least one light-emitting element.

In some embodiments, the encapsulation layer comprises a first inorganic material layer, an organic material layer and a second inorganic material layer which are sequentially stacked along a direction of the light-emitting element away from the backplane, and the wavelength conversion layer is located between the first inorganic material layer and the second inorganic material layer.

In some embodiments, the wavelength conversion layer and the organic material layer are the same layer.

In some embodiments, the wavelength conversion layer comprises red quantum dots and organic material, and a mass ratio of the red quantum dot to the organic material is 20 wt % to 40 wt %.

In some embodiments, the wavelength conversion layer is located between one of the first inorganic material layer and the second inorganic material layer and the organic material layer.

In some embodiments, the wavelength conversion layer is located between the first inorganic material layer and the organic material layer.

According to another aspect of the embodiments of the present disclosure, provided is a taillight, comprising the light-emitting device according to any of the above embodiments.

According to still another aspect of the embodiments of the present disclosure, provided is a vehicle, comprising the taillight according to any of the above embodiments.

According to yet still another aspect of the embodiments of the present disclosure, provided is a manufacturing method of a light-emitting device. The manufacturing method comprises: forming at least one light-emitting element on one side of a backplane, wherein a wavelength of a first light emitted by each of the at least one light-emitting element is 500 nm to 580 nm; forming a wavelength conversion layer on one side of the at least one light-emitting element away from the backplane, wherein the wavelength conversion layer is configured to emit a second light with a different color from the first light under excitation of the first light; and forming a first optical structure on one side of the wavelength conversion layer away from the backplane, wherein the first optical structure comprises one or more optical elements, each of the one or more optical elements being configured to focus the second light along a direction perpendicular to the backplane.

In some embodiments, the manufacturing method further comprises: forming an encapsulation layer, wherein the encapsulation layer is between the at least one light-emitting element and the first optical structure.

In some embodiments, the at least one light-emitting element comprises a plurality of light-emitting elements, and the forming at least one light-emitting element on one side of a backplane comprises: forming a plurality of anodes of the plurality of light-emitting elements on the one side of the backplane; forming a pixel defining layer on one side of the plurality of anodes away from the backplane, wherein the pixel defining layer has a plurality of first openings in one-to-one correspondence with the plurality of anodes, and each of the plurality of first openings exposes at least a part of a corresponding anode; and forming a functional layer and a cathode located on one side of the functional layer away from the backplane in each of the plurality of first openings.

In some embodiments, the forming the wavelength conversion layer comprises: forming a light shielding layer on a surface of the encapsulation layer, wherein the light shielding layer comprises a plurality of second openings, and an orthographic projection of each of the plurality of second openings on the backplane at least partially overlaps with an orthographic projection of a corresponding first opening on the backplane; and forming the wavelength conversion layer, wherein the wavelength conversion layer comprises a plurality of wavelength conversion portions located in the plurality of second openings and spaced apart from each other.

In some embodiments, the pixel defining layer comprises a light shielding material, and the forming the wavelength conversion layer comprises: forming a plurality of wavelength conversion portions spaced apart from each other in the plurality of first openings.

Other features, aspects and advantages of the present disclosure will become apparent from the following detailed description of exemplary embodiments of the present disclosure with reference to the accompanying drawings.

BRIEF DESCRIPTION OF THE DRAWINGS

The accompanying drawings which constitute a part of this specification, illustrate the embodiments of the present disclosure, and together with this specification, serve to explain the principles of the present disclosure.

The present disclosure may be more explicitly understood from the following detailed description with reference to the accompanying drawings, in which.

DESCRIPTION OF THE INVENTION

Figure 1:
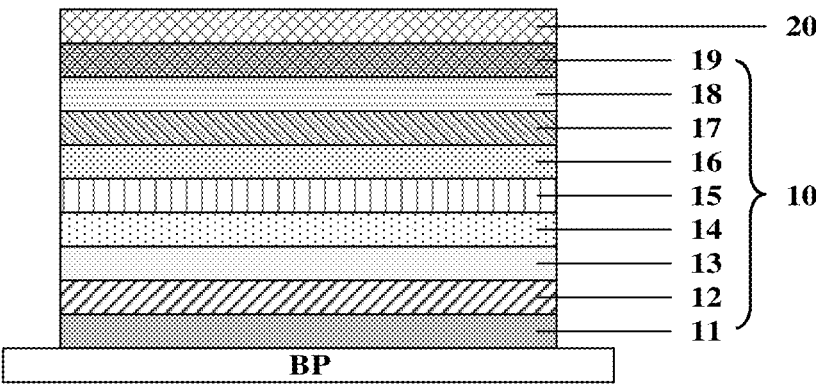
FIG. 1 is a schematic structure view showing a light-emitting device according to some embodiments of the present disclosure.

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity, or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

In the related art, in a light-emitting device for the taillight of a vehicle, a red light quantum dot layer is excited by a blue light emitted by a blue light-emitting device to emit red light, or a red light-emitting device is directly used to emit red light.

The inventors have noticed that the light-emitting device in the related art has a poor performance. On one hand, the light-emitting device has a low luminous efficiency, and if the driving current is increased to improve the brightness, the service life of the light-emitting device will be reduced. Therefore, the brightness and service life of the light-emitting device cannot be balanced. On the other hand, the light-emitting device has a poor color cast performance, that is, the color cast varies significantly within a certain angle range. On still the other hand, the brightness of the light-emitting device is greatly attenuated within a certain angle range.

In view of the above, the embodiments of the present disclosure provide the following technical solutions.

FIG. 1 is a schematic structure view showing a light-emitting device according to some embodiments of the present disclosure.

In some embodiments, as shown in FIG. 1, the light-emitting device comprises at least one light-emitting element 10 and a wavelength conversion layer 20. The wavelength conversion layer 20 is configured to emit a second light with a different color from a first light under the excitation of the first light emitted by the at least one light-emitting element 10.

In some embodiments, the wavelength conversion layer 20 is a red light quantum dot layer.

The at least one light-emitting element 10 is located on one side of the backplane BP, and the wavelength of the first light emitted by each light-emitting element 10 is 500 nm to 580 nm. For example, the wavelength of the light emitted by the light-emitting element 10 is one of the following values: 510 nm, 515 nm, 520 nm, 525 nm, 530 nm, 535 nm, 540 nm, 545 nm, 550 nm, 555 nm, 560 nm, 570 nm, etc. As some implementations, the wavelength of the light emitted by the light-emitting element 10 ranges with one of the above values as the upper limit and the other of the above values as the lower limit. For example, the wavelength of the light emitted by the light-emitting element 10 is 510 nm to 560 nm, 510 nm to 550 nm, or 510 nm to 540 nm.

In some embodiments, the light-emitting element 10 comprises an anode, a cathode, and a functional layer located between the anode and the cathode. Here, the functional layer at least comprises a light-emitting layer, for example an organic light-emitting layer. In some embodiments, the functional layer further comprises one or more of an electron transport layer, an electron injection layer, a hole transport layer and a hole injection layer. In some embodiments, the cathodes of a plurality of light-emitting elements 10 may be integrated, that is, one cathode is shared.

The backplane BP may be provided with a driving circuit for driving the light-emitting element 10 to emit light. The driving circuit may comprise members such as a thin film transistor and a capacitor. For example, one driving circuit may comprise two transistors and one capacitor (2T1C). However, the embodiments of the present disclosure are not limited thereto, and in other embodiments, one driving circuit may also comprise more transistors. As some implementations, one driving circuit may drive one light-emitting device 10 to emit light. As other implementations, one driving circuit may drive a plurality of light-emitting devices 10 to emit light.

In some embodiments, the backplane BP comprises a base substrate, one or more driving circuits located on the base substrate, and a planarization layer covering the one or more driving circuits. In this case, the light-emitting element 10 is located on the surface of the planarization layer.

The wavelength conversion layer 20 is located on one side of the at least one light-emitting element 10 away from the backplane BP.

In some embodiments, the thickness of the wavelength conversion layer 20 is 2 microns to 3 microns, for example, 2.2 microns, 2.5 microns, 2.8 microns, etc.

In some embodiments, the particle size of the red quantum dots in the wavelength conversion layer 20 is 2 nm to 5 nm, for example, 3 nm, 4 nm, etc.

In some embodiments, the material of the wavelength conversion layer 20 may comprise at least one of the following materials: CdS (cadmium sulfide), CdSe (cadmium selenide), CdTe (cadmium telluride), ZnS (zinc sulfide), ZnSe (zinc selenide), ZnTe (zinc telluride), ZnO (zinc oxide), HgS (mercury sulfide), HgSe (mercury selenide), HgTe (mercury telluride), InP (indium phosphide), InAs (indium arsenide), InSb (indium antimonide), GaP (gallium phosphide), GaAs (gallium arsenide), GaSb (gallium antimonide), $AgInS_2$ (silver indium sulfur), $AgInSe_2$ (silver indium selenium), $AgInTe_2$ (silver indium telluride), $AgGaAs_2$ (silver gallium sulfide), $AgGaSe_2$ (silver gallium selenide), $AgGaTe_2$ (silver gallium telluride), $CuInS_2$ (copper indium sulfide), $CuInSe_2$ (copper indium selenide), $CuInTe_2$ (copper indium telluride), $CuGaS_2$ (copper gallium sulfide), $CuGaSe_2$ (copper gallium selenide), $CuGaTe_2$ (copper gallium telluride), Si (silicon), C (carbon), Ge (germanium) and $Cu_2ZnSnS_4$ (copper zinc tin sulfide).

In some embodiments, the wavelength of light emitted by the light-emitting device is 600 nm to 730 nm, for example, 650 nm, 680 nm, 700 nm, 710 nm, etc.

In the light-emitting device of the above embodiments, light with a wavelength between 500 nm and 580 nm serves as the excitation light of the wavelength conversion layer 20. Such a light-emitting device has higher luminous efficiency, a longer service life and a better color cast performance.

For example, when the brightness of the above light-emitting device reaches 2000 nits, compared with the light-emitting device using the blue light-emitting element to excite the red light quantum dot layer, the luminous efficiency of the light-emitting device is improved by 15% to 25%; and compared with the red light-emitting element, the luminous efficiency is improved by 10% to 15%. At the same time, since the light-emitting device has a higher luminous efficiency, the current density required to drive the light-emitting device to reach a same brightness is smaller, so that the light-emitting device has a longer service life, for example, which may reach 8000 hours.

For another example, the value of JNCD (Just Noticeable Color Difference) of the light-emitting device with the light-emitting angle within the range of 0 to 60 degrees is smaller than or equal to 2. The value of JNCD can reflect the color cast degree, and the smaller the value of JNCD is, the smaller the color cast will be.

Figure 2A:
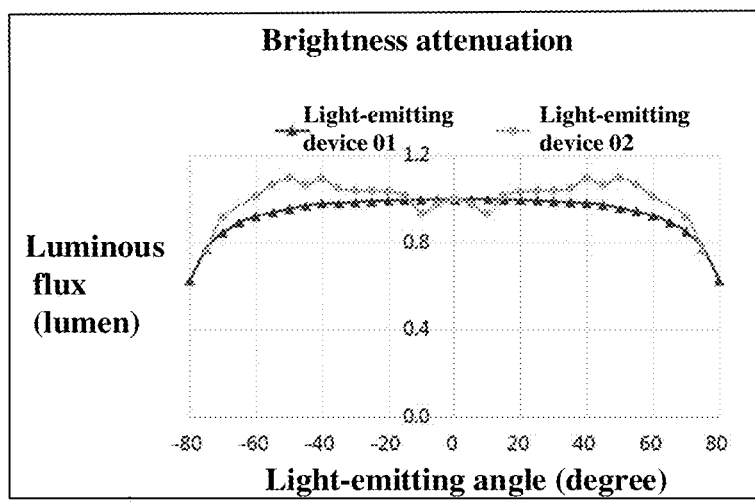
FIG. 2A is a comparison view showing the relationship between a luminous flux and a light-emitting angle of a light-emitting device according to some embodiments of the present disclosure and a light-emitting device in the related art.

FIG. 2A is a comparison view showing the relationship between a luminous flux and a light-emitting angle of a light-emitting device according to some embodiments of the present disclosure and a light-emitting device in the related art. Here, the light-emitting element in the light-emitting device 02 in the related art is a red OLED.

As shown in FIG. 2A, the luminous flux attenuation of the light-emitting device 01 provided by the present disclosure does not vary significantly when the light-emitting angle is within the range of 0 to 60 degrees, and the curve is smoother. However, the luminous flux attenuation of the light-emitting device 02 in the related art is more noticeable, and the luminous flux attenuation is faster as the light-emitting angle increases.

Figure 2B:
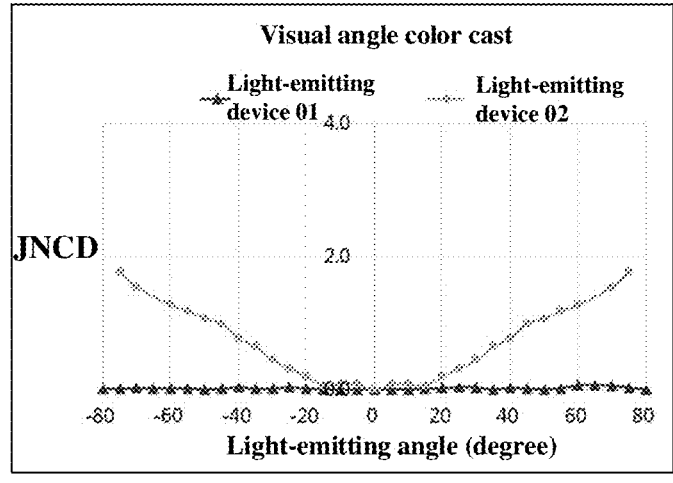
FIG. 2B is a comparison view showing the relationship between a JNCD value and a light-emitting angle of a light-emitting device according to some embodiments of the present disclosure and a light-emitting device in the related art.

FIG. 2B is a comparison view showing the relationship between a JNCD value and a light-emitting angle of a light-emitting device according to some embodiments of the present disclosure and a light-emitting device in the related art.

As shown in FIG. 2B, the JNCD value of the light-emitting device 01 provided by the present disclosure does not vary significantly when the light-emitting angle is within the range of 0 to 60 degrees, and the curve is smoother. However, the JNCD value of the light-emitting device 02 in the related art varies more significantly. Therefore, when the light-emitting device 01 provided by the present disclosure is viewed laterally, the brightness and the chromaticity are not significantly different from those when viewed from the front.

In addition, in the related art, to make the CIEX of the chromatic coordinates of the red light emitted by the red OLED greater than or equal to 0.700, an additional host material is added on the basis of the raw material when the red OLED light-emitting layer is prepared. To add the host material, the device required for evaporation of OLED needs to be modified, which increases the complexity of the manufacturing process. However, in the light-emitting device provided by the present disclosure, the CIEx of the chromatic coordinates of the red light emitted by the light-emitting device in the chromaticity diagram can be greater than a preset value, for example, greater than or equal to 0.7, without modifying the device during the manufacturing process. Compared with the light-emitting device using the red OLED as the light-emitting element, the manufacturing process is simplified and the manufacturing cost is reduced.

In some embodiments, the light-emitting element 10 may comprise an organic light-emitting diode (OLED), for example, a top emitting OLED. As shown in FIG. 1, the light-emitting element 10 may sequentially comprise the following layers from the backplane BP to the wavelength conversion layer 20: an anode 11, a hole transport layer 12, an auxiliary layer 13, a light-emitting layer 14, a hole blocking layer 15, an electron transport layer 16, a cathode 17, a capping layer 18 and a light extraction layer 19. In some embodiments, the hole transport layer 12 may be a P-type doped hole transport layer.

Figure 3:
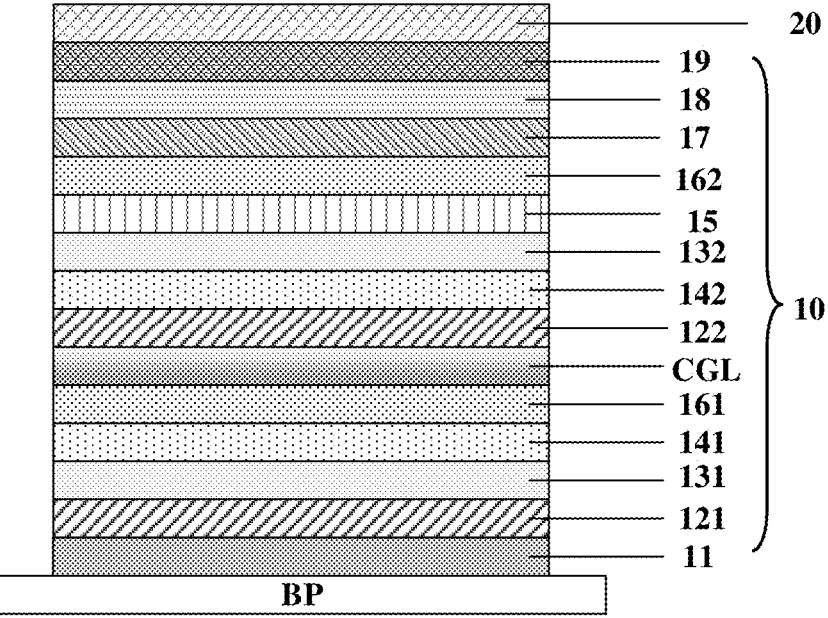
FIG. 3 is a schematic view showing a light-emitting element according to some embodiments of the present disclosure.

FIG. 3 is a schematic structure view showing a light-emitting element according to some embodiments of the present disclosure.

In other embodiments, the light-emitting element comprises a plurality of tandem OLEDs, for example, tandem 2 OLEDs. As shown in FIG. 3, in addition to the anode 11 and the cathode 17, the light-emitting element also comprises the following layers sequentially arranged from the anode 11 to the cathode 17: a first hole transport layer 121, a first auxiliary layer 131, a first light-emitting layer 141, a first electron transport layer 161, a charge generation layer CGL, a second hole transport layer 122, a second light-emitting layer 142, a second auxiliary layer 132, a hole blocking layer 15, and a second electron transport layer 162. In some embodiments, the light-emitting element further comprises a capping layer 18 and a light extraction layer 19 sequentially arranged on one side of the cathode 17 away from the backplane BP. In some embodiments, the charge generation layer CGL may be an N-type doped charge generation layer.

The light-emitting element 10 using a tandem OLED or a laminated light-emitting layer can enhance the overall light-emitting efficiency of the light-emitting device. In some embodiments, compared with the light-emitting element 10 shown in FIG. 1, the efficiency of the light-emitting element with a tandem OLED may be improved by 1.2 times.

In still other embodiments, one or more of the above plurality of layers may be omitted.

In some embodiments, the material of the auxiliary layer 13 may comprise NPB (which is N, N'-Bis(naphthalen-1-yl)-N, N'-bis(phenyl)benzidine), TCTA (which is 4,4',4'-Tris (carbazol-9-yl)-triphenylamine) and TAPC (which is 4,4'-cyclohexylidenebis [N, N-bis(p-tolyl) aniline]). In some embodiments, the material of the P-type doped hole transport layer 12 may comprise one or more of HATCN (1, 4, 5, 8, 9, 11-Hexaazatriphenylenehexacarbonitrile), F4TCNQ (2, 3, 5, 6-tetrafluoro-7, 7, 8, 8-tetracyanoquinodimethane) and PPDN (pyrazino [2, 3-f] [1, 10] phenanthroline-2, 3-dicarbonitrile).

In some embodiments, the thickness of the light-emitting element 10 is 0.2 micron to 0.5 micron, for example, 0.4 micron.

Figure 4A:
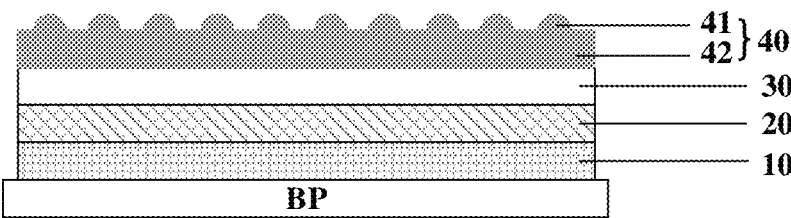
FIG. 4A is a schematic structure view showing a light-emitting device according to other embodiments of the present disclosure.

FIG. 4A is a schematic structure view showing a light-emitting device according to other embodiments of the present disclosure.

In some embodiments, as shown in FIG. 4A, the light-emitting device further comprises a first optical structure 40 located on one side of the wavelength conversion layer 20 away from the backplane BP and comprises one or more optical elements 41. Each optical element 41 is configured to focus the first light emitted by the light-emitting element

10 along a direction perpendicular to the backplane BP. In such a light-emitting device, the first optical structure 40 may improve the brightness of the light-emitting device along the direction perpendicular to the backplane BP (that is, the brightness of the front) by focusing the light.

In some embodiments, as shown in FIG. 4A, the light-emitting device further comprises an encapsulation layer 30. The encapsulation layer 30 is located between the at least one light-emitting element 10 and the first optical structure 40. It is to be noted that, although the encapsulation layer 30 shown in FIG. 4A is located on one side of the wavelength conversion layer 20 away from the backplane BP, this is not restrictive. In other embodiments, the positions of the encapsulation layer 30 and the wavelength conversion layer 20 may be interchanged, or the wavelength conversion layer 20 may be located within the encapsulation layer 30, which will be described later in conjunction with different embodiments.

In other embodiments, as shown in FIG. 4A, the first optical structure 40 further comprises a substrate 42 located between the one or more optical elements 41 and the encapsulation layer 30. In some embodiments, the thickness of the substrate 42 is 10 microns to 30 microns, for example, 15 microns, 20 microns, 25 microns, etc. The substrate 42 is arranged between the optical element 41 and the encapsulation layer 30, which is conductive to reducing or avoiding the adverse effect on the encapsulation layer 30 during the process of forming the optical elements 41, thereby further improving the performance of the light-emitting device.

In some embodiments, the material of at least one of the one or more optical elements 41 is the same as the material of the substrate 42. For example, the material of at least one of the one or more optical elements 41 and the material of the substrate 42 each is optical adhesive. In some implementations, the above optical adhesive comprises one or more of acrylic resin, polyurethane resin, silicone resin and epoxy resin. The manufacturing process of the first optical structure 40 may be simplified by preparing the optical element 41 and the substrate 42 using the same material.

In some embodiments, one or more optical elements 41 are integrally provided with the substrate 42. In this way, the overall stability of the optical device is improved.

Some implementations of the optical element 41 will be described below in conjunction with FIGS. 4B and 4C.

Figure 4B:
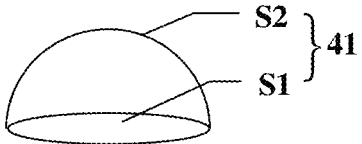
FIG. 4B is a schematic structure view showing an optical element 41 according to some embodiments of the present disclosure.

FIG. 4B is a schematic structure view showing an optical element 41 according to some embodiments of the present disclosure.

In some embodiments, referring to FIG. 4B, at least one optical element 41 comprises a first surface S1 close to the backplane BP and a second surface S2. The second surface S2 is connected with the first surface S1, and located on one side of the first surface S1 away from the backplane BP. Here, the second surface S2 is at least a part of a curved surface of a half of a solid. The solid is one of a sphere and an ellipsoid. For example, the second surface S2 is the curved surface of a half of a sphere. For another example, the second surface S2 is the curved surface of a half of an ellipsoid. With such a structure, the second surface of at least one optical element 41 protrudes towards one side away from the backplane BP to form a lens. In this way, the light exiting from the encapsulation layer 30 is focused after exiting from the second surface of the optical element 41.

In some embodiments, the first surface S1 is a plane. For example, the optical element 41 is a half of a sphere or a half of an ellipsoid. In this way, it is more conductive to focusing the second light along the direction perpendicular to the backplane.

In some embodiments, the second surface S2 is at least a part of the curved surface of a half of a sphere, and the radius of the sphere is 10 microns to 25 microns, for example, 15 microns, 20 microns, etc. When the second surface of the optical element 41 is at least a part of the curved surface of a half of a sphere, the light emitted from the second surface of the optical element 41 after being focused by the optical element 41 is more uniform, so that the light emitted by the light-emitting device is more uniform.

Figure 4C:
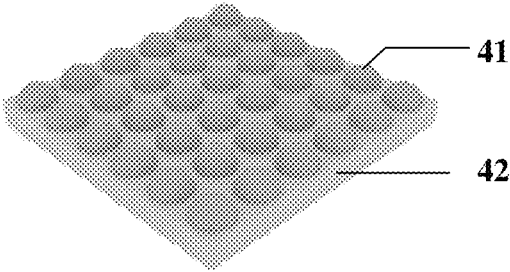
FIG. 4C is a schematic view showing the arrangement of optical elements 41 according to some embodiments of the present disclosure.

FIG. 4C is a schematic view showing the arrangement of optical elements 41 according to some embodiments of the present disclosure.

As shown in FIG. 4C, one or more optical elements 41 in the first optical structure 40 comprise a group of optical elements arranged in a matrix. For example, all the optical elements 41 in the first optical structure 40 are arranged in a matrix. The optical elements 41 arranged in a matrix makes the light exiting from the first optical structure 40 more uniform as a whole.

In some embodiments, the distance between any two adjacent optical elements 41 is 10 microns to 20 microns, for example, 15 microns, 18 microns, etc. In this way, the light exiting from the first optical structure 40 is more uniform as a whole.

The inventors have also noticed that, although the brightness of the light-emitting device along the direction perpendicular to the backplane BP can be improved by providing the first optical structure 40, it is also possible to result in that the brightness of the light-emitting device in other directions is unfavorably attenuated and the JNCD value of the light-emitting device in other directions varies significantly, that is, a poor chromatic dispersion performance. To balance the brightness of the light-emitting device along the direction perpendicular to the backplane BP, the brightness of the light-emitting device in other directions, and the chromatic dispersion performance of the light-emitting device, the embodiments of the present disclosure also provide the following solutions.

Figure 5:
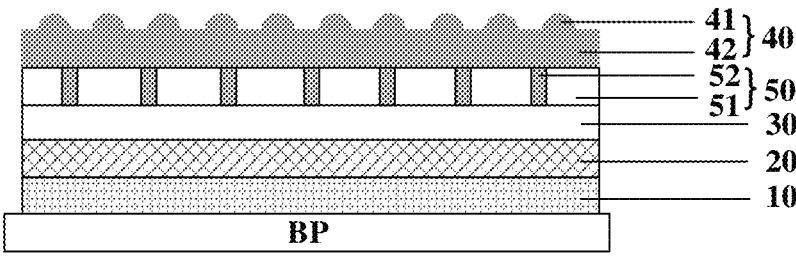
FIG. 5 is a schematic structure view showing a light-emitting device according to further embodiments of the present disclosure.

FIG. 5 is a schematic structure view showing a light-emitting device according to further embodiments of the present disclosure.

As shown in FIG. 5, the light-emitting device further comprises a second optical structure 50 located between the first optical structure 40 and the encapsulation layer 30 and comprises a dimming portion 51. The refractive index of the dimming portion 51 is smaller than the refractive index of the substrate 42.

The light exiting from the encapsulation layer 30 might be totally reflected in the substrate 42 after being incident into the substrate 42 along other directions than the direction perpendicular to the backplane BP, which results in a poor chromatic dispersion performance of the light-emitting device. The dimming portion 51 may reduce the waveguide effect of the light exiting from the encapsulation layer 30 in the substrate 42, and reduce the probability that the light cannot exit from the substrate 42 after entering the substrate 42. In this way, the attenuation of the brightness of the light-emitting device in other directions is reduced.

Figure 6A:
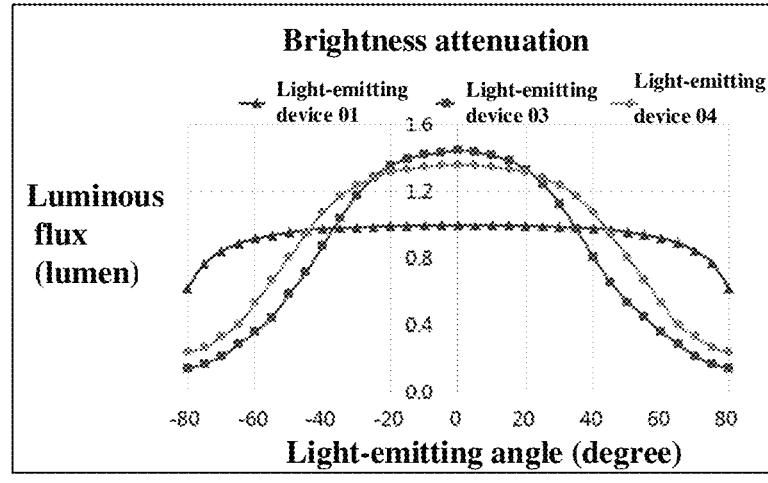
FIG. 6A is a comparison view showing the relationship between a luminous flux and a light-emitting angle of a light-emitting device comprising an optical structure and a light-emitting device not comprising an optical structure according to some embodiments of the present disclosure.

FIG. 6A is a comparison view showing the relationship between a luminous flux and a light-emitting angle of a light-emitting device comprising an optical structure and a light-emitting device not comprising an optical structure according to some embodiments of the present disclosure.

In FIG. 6A, the light-emitting device 01 does not comprise the first optical structure 40 and the second optical structure 50, the light-emitting device 03 only comprises the first optical structure 40, and the light-emitting device 04 comprises the first optical structure 40 and the second optical structure 50 at the same time.

In some embodiments, as shown in FIG. 6A, compared with the light-emitting device 01, the front brightness of the light-emitting device 04 is improved by at least 20%, while the brightness of 60° is attenuated by smaller than 50% (for example, 45%).

Figure 6B:
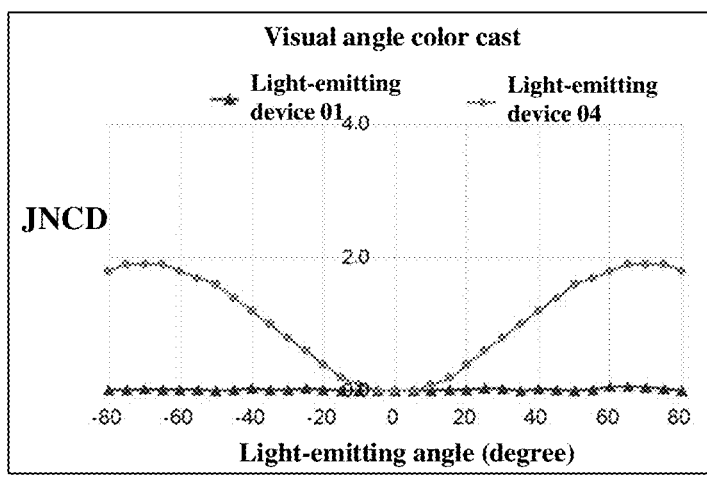
FIG. 6B is a comparison view showing the relationship between a JNCD value and a light-emitting angle of a light-emitting device comprising an optical structure and a light-emitting device not comprising an optical structure according to some embodiments of the present disclosure.

FIG. 6B is a comparison view showing the relationship between a JNCD value and a light-emitting angle of a light-emitting device comprising an optical structure and a light-emitting device not comprising an optical structure according to some embodiments of the present disclosure.

In some embodiments, as shown in FIG. 6B, the JNCD value of the light-emitting device 04 at 60° is less than 2 (for example, 1.8).

As can be seen from FIGS. 6A and 6B, the light-emitting device 04 comprising both the first optical structure 40 and the second optical structure 50 at the same time can balance the brightness of the light-emitting device 04 along the direction perpendicular to the backplane BP, the brightness of the light-emitting device 04 in other directions, and the chromatic dispersion performance of the light-emitting device 04.

In some embodiments, as shown in FIG. 5, the second optical structure further comprises a plurality of supports 52, and the dimming portion 51 is in a gap between any two adjacent supports 52 of the plurality of supports 52. The support 52 can be used for supporting the first optical structure 40 to improve the overall stability of the light-emitting device.

In some embodiments, the dimming portion 51 comprises an optical medium. As some implementations, the optical medium is air. The refractive index of air is low, which meets the requirement of the second optical structure on the one hand and makes it more convenient to implement in process on the other hand. As other implementations, the optical medium comprises a plurality of types of optical media, for example, a first type of optical medium and a second type of optical medium located between the first optical medium and the first optical structure. For example, one type of the plurality of types of optical media may be air.

In some embodiments, the plurality of supports 52 are in a grid shape. The plurality of supports 52 in a grid shape arrangement can not only improve the stability of the first optical structure 40, but also make the distribution of the dimming portions 51 more uniform, thereby making the light exiting from the first optical structure 40 more uniform.

In some embodiments, the distance between any two adjacent supports 52 is greater than the distance between any two adjacent optical elements 41. In some embodiments, the distance between any two adjacent supports 52 is 50 microns to 80 microns, for example, 60 microns, 70 microns, 75 microns, etc. In some embodiments, the height of the support 52 is 20 microns to 40 microns, for example, 25 microns, 30 microns, 35 microns, etc. The support 52 mainly supports the first optical structure 40, and the optical element 41 is used for focusing light. The distance between two adjacent supports 52 is set to be greater than the distance between two adjacent optical elements 41, such that the probability that the supports 52 blocks the optical element 41 is reduced, thereby improving the light transmittance of the first optical structure 40 and lessening the optical energy loss due to the support 52.

In some embodiments, the refractive index of the support 52 is the same as the refractive index of the substrate 40. For example, the material of the support 52 is the same as the material of the substrate 40, and the support 52 and the substrate 40 are integrally provided. In this way, it is conductive to further reducing the loss of light incident from the dimming portion 51 to the support 52 and the loss of light incident from the support 52 to the substrate 40.

Next, different encapsulation methods of the light-emitting device will be introduced in conjunction with FIGS. 7-11.

Figure 7:
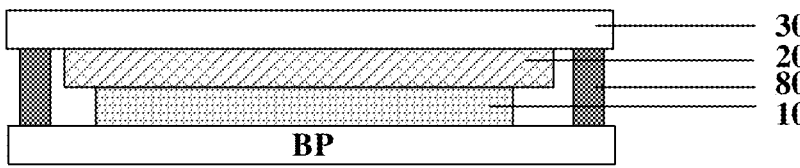
FIGS. 7-9 are schematic structure views showing a light-emitting device according to still other embodiments of the present disclosure.
Figure 8:
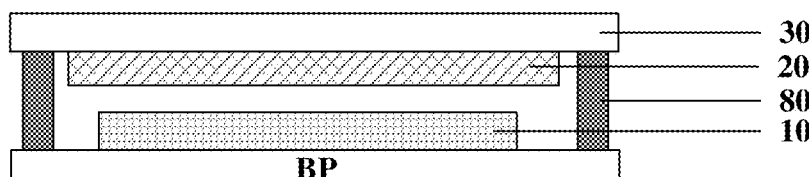
Figure 9:
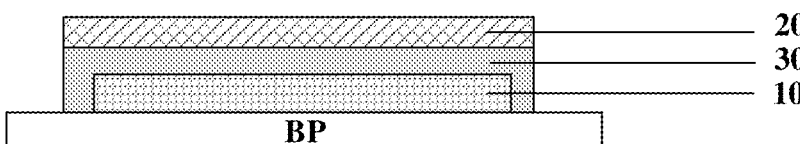

FIGS. 7-9 are schematic structure views showing a light-emitting device according to still other embodiments of the present disclosure.

In some embodiments, as shown in FIGS. 7-9, one of the encapsulation layer 30 and the wavelength conversion layer 20 is located between the other and the at least one light-emitting element 10.

In some embodiments, as shown in FIGS. 7 and 8, the wavelength conversion layer 20 is located between the encapsulation layer 30 and the light-emitting element 10. For example, the light-emitting device is rigidly encapsulated. In this case, the encapsulation layer 30 is encapsulation glass fixed on the backplane BP by a sealant 80. In some implementations, the thickness of the sealant 80 is 3 microns to 6 microns, for example, 5 microns.

In other embodiments, as shown in FIG. 8, the wavelength conversion layer 20 is located between the encapsulation layer 30 and the light-emitting element 10, and there is a spacing between the wavelength conversion layer 20 and the light-emitting element 10. In some implementations, the spacing is 1.5 microns to 2 microns, for example 1.8 microns, etc. The above method can avoid that the wavelength conversion layer 20 extrudes the light-emitting element 10 to result in that the light-emitting element 10 is malfunctioned.

In still other embodiments, as shown in FIG. 9, the encapsulation layer 30 is located between the wavelength conversion layer 20 and the light-emitting element 10. For example, during flexible encapsulation, the encapsulation layer 30 is a thin film encapsulation layer covering the light-emitting element 10, and the wavelength conversion layer 30 may be located on one side of the encapsulation layer 30 away from the backplane BP.

Figure 10A:
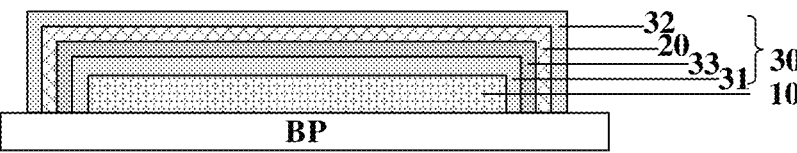
FIGS. 10A, 10B and 11 are schematic structure views showing a light-emitting device according to still further embodiments of the present disclosure.
Figure 10B:
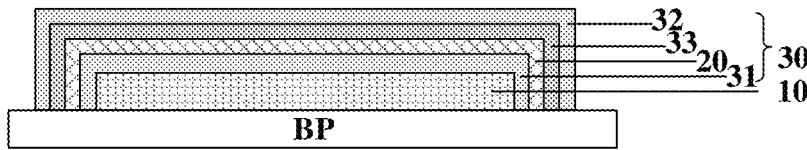
Figure 11:
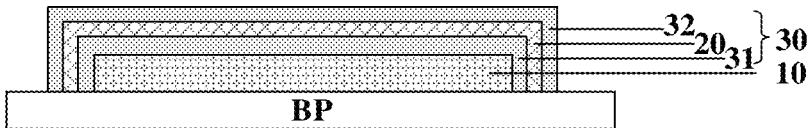

FIGS. 10A, 10B and 11 are schematic structure views showing a light-emitting device according to still further embodiments of the present disclosure.

As shown in FIGS. 10A, 10B and 11, the wavelength conversion layer 20 is located within the encapsulation layer 30. In this way, the wavelength conversion layer 20, whilst converting the light emitted by the light-emitting element 10 into red light, may also serve as a part of the encapsulation layer 30 to produce the effect of protecting the light-emitting element 10 and prolonging the service life of the light-emitting element 10.

In some embodiments, the encapsulation layer 30 comprises a first inorganic material layer 31 and a second inorganic material layer 32 located on one side of the first inorganic material layer 31 away from the backplane BP, and the wavelength conversion layer 20 is located between the first inorganic material layer 31 and the second inorganic material layer 32.

In some embodiments, the encapsulation layer 30 further comprises an organic material layer 33 located between the first inorganic material layer 31 and the second inorganic material layer 32. In some implementations, the thickness of the organic material layer 33 is 6 microns to 8 microns, for example, 7 microns, 7.5 microns, etc.

Different implementations of the organic material layer 33 and the wavelength conversion layer 20 will be introduced below.

As some implementations, the wavelength conversion layer 20 is located between one of the first inorganic material layer 31 and the second inorganic material layer 32 and the organic material layer 33.

For example, as shown in FIG. 10A, the wavelength conversion layer 20 is located between the organic material layer 33 and the second inorganic material layer 32.

For another example, as shown in FIG. 10B, the wavelength conversion layer 20 is located between the first inorganic material layer 31 and the organic material layer 33. The wavelength conversion layer 20 is required to be cured by irradiation of light (for example, ultraviolet light) during the preparation process, and the irradiation of light might cause the organic material layer 33 to release gas which might affect the luminous efficiency of the optical element 10 after entering the optical element 10. Therefore, the position of the wavelength conversion layer in FIG. 10B can avoid that the organic material layer 33 generates gas to affect the luminous efficiency of the light-emitting element 10 when forming the wavelength conversion layer 20.

As other implementations, as shown in FIG. 11, the wavelength conversion layer 20 and the organic material layer 33 are the same layer. For example, the same layer comprises a mixed material obtained by mixing red quantum dots and organic material. In some implementations, the red quantum dots are added into the organic material in a doped manner to obtain the mixed material. The mixed material is printed as the wavelength conversion layer 20 by an inkjet printing process. The wavelength conversion layer 20 and the organic material layer 33 are formed into one layer so that the thickness of the light-emitting device is reduced.

In some embodiments, the wavelength conversion layer 20 comprises red quantum dots and organic material, and the weight percentage of the red quantum dots in the wavelength conversion layer 20 is 20 wt % to 40 wt % (that is, the mass ratio of the red quantum dots to the organic material is within the range of 1:4 to 2:3). In this way, the thickness of the light-emitting device is reduced while balancing the light conversion effect of the wavelength conversion layer 20.

In some embodiments, the wavelength conversion layer 10 is formed of an organic material. In this case, the wavelength conversion layer 20 may replace the organic material layer 33 as a part of the encapsulation layer 30.

The embodiments of the present disclosure also provide a lamp, which may comprise the light-emitting device according to any of the above embodiments.

In some embodiments, the above lamp comprises a vehicle lamp. In some embodiments, the vehicle lamp is a taillight.

The embodiments of the present disclosure also provide a vehicle comprising the lamp according to any of the above embodiments. In some embodiments, the vehicle is an automobile.

Figure 12:
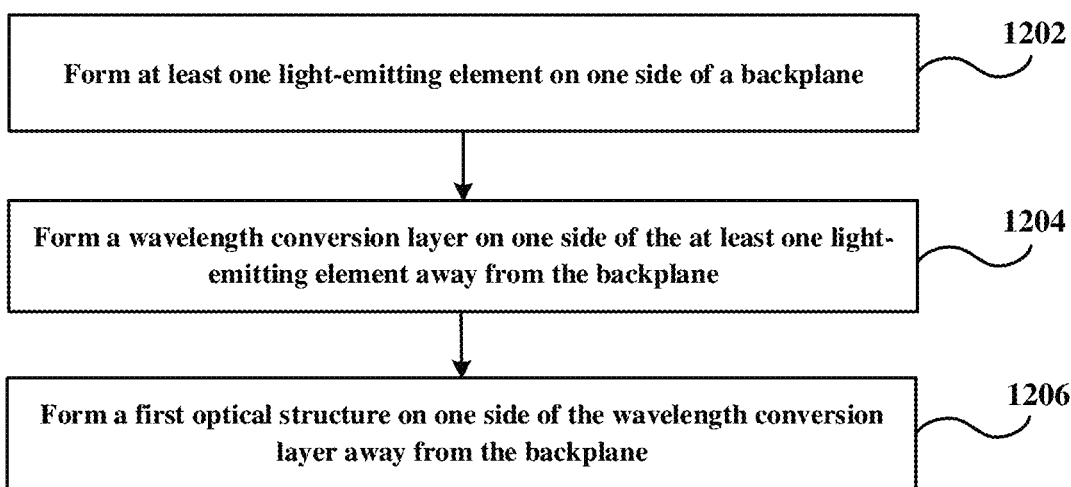
FIG. 12 is a flowchart showing a manufacturing method of a light-emitting device according to some embodiments of the present disclosure.

FIG. 12 is a flowchart showing a manufacturing method of a light-emitting device according to some embodiments of the present disclosure.

As shown in FIG. 12, the manufacturing method of a light-emitting device comprises steps 1202, 1204 and 1206.

At step 1202, at least one light-emitting element is formed on one side of the backplane. The wavelength of a first light emitted by each light-emitting element is 500 nm to 580 nm. In some embodiments, the light-emitting element may be an OLED.

At step 1204, a wavelength conversion layer is formed on one side of the at least one light-emitting element away from the backplane. The wavelength conversion layer is configured to emit a second light with a different color from the first light under the excitation of the first light.

At step 1206, a first optical structure is formed on one side of the wavelength conversion layer away from the backplane. The first optical structure comprises one or more optical elements, each optical element is configured to focus the second light along the direction perpendicular to the backplane.

In some embodiments, the above method further comprises forming an encapsulation layer which is located between the at least one light-emitting element and the first optical structure.

In some embodiments, a plurality of light-emitting elements is formed on one side of the backplane. The process of forming a plurality of light-emitting elements will be introduced below in conjunction with FIG. 13.

Figure 13:
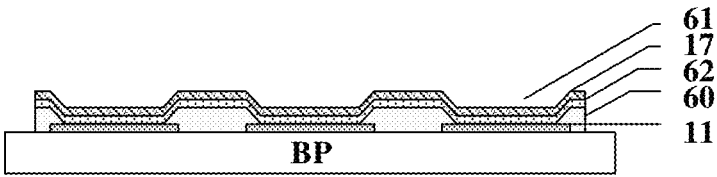
FIG. 13 is a schematic structure view showing a plurality of light-emitting elements according to some embodiments of the present disclosure.

FIG. 13 is a schematic structure view showing a plurality of light-emitting elements according to some embodiments of the present disclosure.

First, a plurality of anodes 11 of a plurality of light-emitting elements 10 is formed on one side of the backplane BP. It should be understood that the plurality of anodes 11 is spaced apart from each other.

Then, a pixel defining layer 60 is formed on one side of the plurality of anodes 11 away from the backplane BP. The pixel defining layer 60 has a plurality of first openings 61 in one-to-one correspondence with the anodes 11, and each first opening 61 exposes at least a part of a corresponding anode 11. In other words, the orthographic projection of each first opening 61 on the backplane BP overlaps with at least a part of the orthographic projection of the corresponding anode 11 on the backplane BP.

In some embodiments, a pixel defining material is formed on the surface of the backplane BP formed with a plurality of anodes 11, and then the pixel defining material is patterned (for example, by an exposure development process) to form the pixel defining layer 60 having a plurality of first openings 61.

In some embodiments, the thickness of the pixel defining layer 60 is 1 micron to 3 microns, for example, 2 microns, 2.5 microns, etc. In some embodiments, the material of the pixel defining layer 60 comprises polyimide.

Next, a functional layer 62 and a cathode 17 located on one side of the functional layer 62 away from the backplane are formed in each first opening 61. For example, the functional layer 62 and the cathode 17 are formed by an evaporation deposition process.

For example, as shown in FIG. 1, the functional layer 62 comprises a hole transport layer 12 (P-type doped), an auxiliary layer 13, a light-emitting layer 14, a hole blocking layer 15 and an electron transport layer 16.

In some embodiments, other layers may also be formed on one side of the cathode 63 away from the backplane, thereby forming a plurality of light-emitting elements 10.

After forming a plurality of light-emitting elements 10, by controlling the anode and cathode of the light-emitting elements 10 in a designated area, some light-emitting elements 10 in the designated area may be controlled to emit light, so that the light-emitting device emits light in partitioned areas. For example, a plurality of light-emitting elements 10 may be controlled to emit light row by row.

Figure 14:
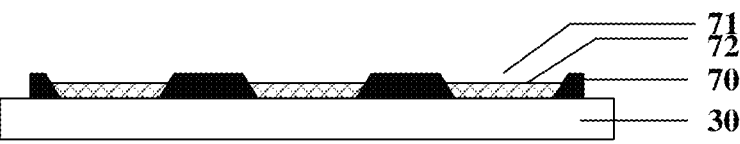
FIG. 14 is a schematic structure view showing a wavelength conversion layer according to some embodiments of the present disclosure.

The process of forming the wavelength conversion layer 20 will be introduced in conjunction with FIG. 14.

FIG. 14 is a schematic structure view showing a wavelength conversion layer according to some embodiments of the present disclosure.

First, a light shielding layer 70 is formed on the surface of the encapsulation layer 30. The light shielding layer 70 comprises a plurality of second openings 71, and the orthographic projection of each second opening 71 on the backplane BP at least a partially overlaps with the orthographic projection of a corresponding first opening 61 on the backplane BP.

In some embodiments, the light shielding layer 70 is a black matrix.

Next, a wavelength conversion layer 20 is formed. The wavelength conversion layer 20 comprises a plurality of wavelength conversion portions 72 located in the plurality of second openings 71 and spaced apart from each other.

In the above embodiments, different wavelength conversion portions 72 in the wavelength conversion layer 20 are spaced apart by the light shielding layer 70. In this way, when the light-emitting device emits light in a partitioned area, the mutual interference of light emitted by different light-emitting elements is reduced, which is conductive to improving the definition of light emission in a partitioned area.

Figure 15A:
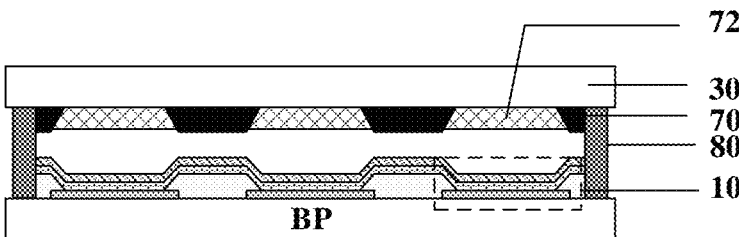
FIGS. 15A and 15B are schematic structure views showing a light-emitting device comprising a plurality of light-emitting elements according to some embodiments of the present disclosure.
Figure 15B:
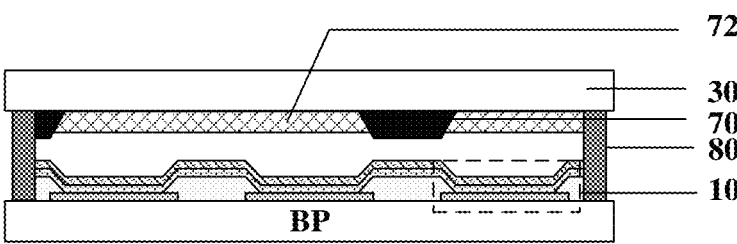

FIGS. 15A and 15B are schematic structure views showing a light-emitting device comprising a plurality of light-emitting elements according to some embodiments of the present disclosure.

In some embodiments, as shown in FIGS. 15A and 15B, the light shielding layer 70 is formed on the surface of the encapsulation layer 30 close to the backplane BP. For example, in the case of rigid encapsulation, the light shielding layer 70 is formed on the surface of the encapsulation layer 30, and a plurality of wavelength conversion portions 72 is formed in the second openings 72 in the light shielding layer 70. Then, the encapsulation layer 30 is fixed on the backplane BP by the sealant 80. After fixing, the surface of the encapsulation layer 30 on which the light shielding layer 70 is formed faces towards the backplane BP.

In some implementations, as shown in FIG. 15A, the plurality of light-emitting elements 10 is in one-to-one correspondence with the plurality of wavelength conversion portions 72.

In other implementations, as shown in FIG. 15B, one wavelength conversion portion 72 corresponds to more than one light-emitting element 10. When the light-emitting device emits light in partitioned areas, the light transmission areas are defined by the wavelength conversion portion 72, thus the mutual interference of light emitted by a plurality of light-emitting elements 10 in different light transmission areas is reduced.

Figure 16:
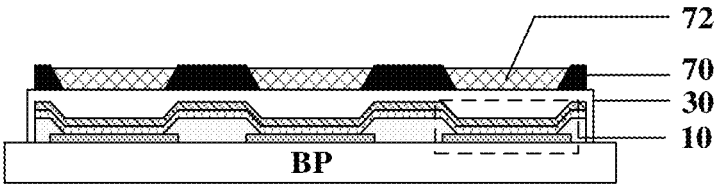
FIG. 16 is a schematic structure view showing a light-emitting device comprising a plurality of light-emitting elements according to further embodiments of the present disclosure.

FIG. 16 is a schematic structure view showing a light-emitting device comprising a plurality of light-emitting elements according to further embodiments of the present disclosure.

In other embodiments, as shown in FIG. 16, the light shielding layer 70 is formed on the surface of the encapsulation layer 30 away from the backplane BP. For example, in the case of flexible encapsulation, after a plurality of light-emitting elements 10 is formed on one side of the backplane BP, an encapsulation layer 30 is formed on one side of the plurality of light-emitting elements 10 away from the backplane BP. Then, the light shielding layer 70 is formed on one side of the encapsulation layer 30 away from the backplane BP, and a plurality of wavelength conversion portions 72 is formed in the second openings 71 in the light shielding layer 70.

After encapsulation by way of the above two methods, when the light-emitting device emits light in partitioned areas, each light-emitting element 10 performs light conversion by a respective corresponding wavelength conversion portion 72, and the illuminated area of the light-emitting device has a clearer edge.

Figure 17:
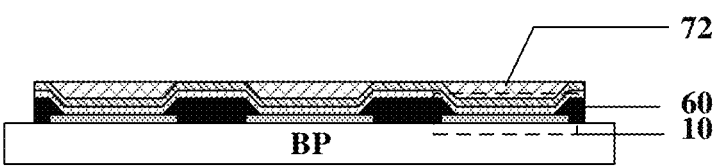
FIG. 17 is a schematic structure view showing a light-emitting device comprising a plurality of light-emitting elements according to still other embodiments of the present disclosure.

FIG. 17 is a schematic structure view showing a light-emitting device comprising a plurality of light-emitting elements according to still other embodiments of the present disclosure.

In some embodiments, as shown in FIG. 17, the pixel defining layer 60 comprises a light shielding material. In this case, a plurality of wavelength conversion portions 72 spaced apart from each other may be formed in the plurality of first openings 61. In some embodiments, the thickness of the pixel defining layer 60 comprising the light shielding material is 4 microns to 8 microns, for example, 5 microns, 6 microns, etc.

In the above embodiments, the pixel defining layer 60 is formed of a light-shielding material, without additionally forming a separate light-shielding layer, which simplifies the step of forming the light-emitting device, thereby saving the mask, and reducing the manufacturing cost of the light-emitting device.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A light-emitting device, comprising:
   at least one light-emitting element located on one side of a backplane, wherein a wavelength of a first light emitted by each of the at least one light-emitting element is 500 nm to 580 nm;
   a wavelength conversion layer located on one side of the at least one light-emitting element away from the backplane and configured to emit a second light with a different color from the first light under excitation of the first light;
   a first optical structure located on one side of the wavelength conversion layer away from the backplane, and comprising one or more optical elements and a substrate, each of the one or more optical elements being configured to focus the second light along a direction perpendicular to the backplane;
   an encapsulation layer located between the at least one light-emitting element and the first optical structure, the substrate being located between the at least one optical element and the encapsulation layer; and
   a second optical structure located between the first optical structure and the encapsulation layer, and comprising a dimming portion, wherein a refractive index of the dimming portion is smaller than a refractive index of the substrate.

2. The light-emitting device according to claim 1, wherein the wavelength conversion layer is a red light quantum dot layer.

3. The light-emitting device according to claim 1, wherein a material of at least one optical element of the one or more optical elements is the same as a material of the substrate, and the at least one optical element and the substrate are integrally provided.

4. The light-emitting device according to claim 1, wherein at least one of the one or more optical elements comprises:
a first surface close to the backplane; and
a second surface connected with the first surface and located on one side of the first surface away from the backplane, wherein the second surface is at least a part of a curved surface of a half of a solid, and the solid is one of a sphere and an ellipsoid.

5. The light-emitting device according to claim 4, wherein the solid is a sphere having a radius of 10 microns to 25 microns.

6. The light-emitting device according to claim 1, wherein the second optical structure further comprises:
a plurality of supports, wherein the dimming portion is in a gap between any two adjacent supports of the plurality of supports.

7. The light-emitting device according to claim 6, wherein the dimming portion comprises optical medium.

8. The light-emitting device according to claim 7, wherein the optical medium is air.

9. The light-emitting device according to claim 1, wherein one of the encapsulation layer and the wavelength conversion layer is located between the other of the encapsulation layer and the wavelength conversion layer and the at least one light-emitting element.

10. The light-emitting device according to claim 1, wherein the encapsulation layer comprises a first inorganic material layer, an organic material layer and a second inorganic material layer which are sequentially stacked along a direction of the at least one light-emitting element away from the backplane, and the wavelength conversion layer is located between the first inorganic material layer and the second inorganic material layer.

11. The light-emitting device according to claim 10, wherein the wavelength conversion layer and the organic material layer are the same layer.

12. The light-emitting device according to claim 11, wherein the wavelength conversion layer comprises red quantum dots and organic material, and weight percentage of the red quantum dot in the wavelength conversion layer is 20 wt % to 40 wt %.

13. The light-emitting device according to claim 10, wherein the wavelength conversion layer is located between one of the first inorganic material layer and the second inorganic material layer and the organic material layer.

14. The light-emitting device according to claim 13, wherein the wavelength conversion layer is located between the first inorganic material layer and the organic material layer.

15. A taillight, comprising the light-emitting device according to claim 1.

16. A vehicle, comprising the taillight according to claim 15.

17. A manufacturing method of a light-emitting device, comprising:
forming at least one light-emitting element on one side of a backplane, wherein a wavelength of a first light emitted by each of the at least one light-emitting element is 500 nm to 580 nm;
forming a wavelength conversion layer on one side of the at least one light-emitting element away from the backplane, wherein the wavelength conversion layer is configured to emit a second light with a different color from the first light under excitation of the first light; and
forming a first optical structure on one side of the wavelength conversion layer away from the backplane, wherein the first optical structure comprises one or more optical elements and a substrate, each of the one or more optical elements being configured to focus the second light along a direction perpendicular to the backplane;
forming an encapsulation layer, wherein the encapsulation layer is between the at least one light-emitting element and the first optical structure, the substrate being located between the at least one optical element and the encapsulation layer; and
forming a second optical structure located between the first optical structure and the encapsulation layer, and comprising a dimming portion, wherein a refractive index of the dimming portion is smaller than a refractive index of the substrate.

18. The manufacturing method according to claim 17, further comprising:
wherein the at least one light-emitting element comprises a plurality of light-emitting elements, and forming the at least one light-emitting element on one side of a backplane comprises:
forming a plurality of anodes of the plurality of light-emitting elements on the one side of the backplane;
forming a pixel defining layer on one side of the plurality of anodes away from the backplane, wherein the pixel defining layer has a plurality of first openings in one-to-one correspondence with the plurality of anodes, and each of the plurality of first openings exposes at least a part of a corresponding anode; and
forming a functional layer and a cathode located on one side of the functional layer away from the backplane in each of the plurality of first openings;
wherein forming the wavelength conversion layer comprises:
forming a light shielding layer on a surface of the encapsulation layer, wherein the light shielding layer comprises a plurality of second openings, and an orthographic projection of each of the plurality of second openings on the backplane at least partially overlaps with an orthographic projection of a corresponding first opening on the backplane; and
forming the wavelength conversion layer, wherein the wavelength conversion layer comprises a plurality of wavelength conversion portions located in the plurality of second openings and spaced apart from each other;
or
wherein the pixel defining layer comprises a light shielding material, and forming the wavelength conversion layer comprises:
forming a plurality of wavelength conversion portions spaced apart from each other in the plurality of first openings.

19. A light-emitting device, comprising:
at least one light-emitting element located on one side of a backplane, wherein a wavelength of a first light emitted by each of the at least one light-emitting element is 500 nm to 580 nm;
a wavelength conversion layer located on one side of the at least one light-emitting element away from the backplane and configured to emit a second light with a different color from the first light under excitation of the first light;

a first optical structure located on one side of the wavelength conversion layer away from the backplane, and comprising one or more optical elements, each of the one or more optical elements being configured to focus the second light along a direction perpendicular to the backplane;

an encapsulation layer located between the at least one light-emitting element and the first optical structure, wherein the encapsulation layer comprises a first inorganic material layer, an organic material layer and a second inorganic material layer which are sequentially stacked along a direction of the at least one light-emitting element away from the backplane, and the wavelength conversion layer is located between the first inorganic material layer and the second inorganic material layer.

* * * * *